(12) United States Patent
Van Gaever

(10) Patent No.: US 11,791,430 B2
(45) Date of Patent: Oct. 17, 2023

(54) SOLAR PANEL AND METHOD FOR PRODUCING THE SOLAR PANEL

(71) Applicant: The Boeing Company, Chicago, IL (US)

(72) Inventor: Kevin B. Van Gaever, Marina del Rey, CA (US)

(73) Assignee: THE BOEING COMPANY, Chicago, IL (US)

( * ) Notice: Subject to any disclaimer, the term of this patent is extended or adjusted under 35 U.S.C. 154(b) by 205 days.

(21) Appl. No.: 16/878,469

(22) Filed: May 19, 2020

(65) Prior Publication Data

US 2021/0367089 A1 Nov. 25, 2021

(51) Int. Cl.
*H01L 31/049* (2014.01)
*H02S 10/40* (2014.01)
(Continued)

(52) U.S. Cl.
CPC ............. *H01L 31/049* (2014.12); *B32B 3/12* (2013.01); *B32B 3/20* (2013.01); *B32B 37/18* (2013.01); *B32B 41/00* (2013.01); *H01L 31/0504* (2013.01); *H01L 31/18* (2013.01); *H02S 10/40* (2014.12); *H02S 50/10* (2014.12);
(Continued)

(58) Field of Classification Search
CPC ... H01L 31/049; H01L 31/0504; H01L 31/18; B32B 3/12; B32B 3/20; B32B 37/18; B32B 41/00; B32B 2041/04; B32B 2305/34; B32B 2307/202; B32B 2307/206; B32B 2457/12; B32B 2605/08; H02S 10/40; H02S 50/10; B64C 39/024; B64C 2201/042; B64D 27/24; B64D 2211/00; Y02E 10/50; Y02T 50/50; B64G 1/443
See application file for complete search history.

(56) References Cited

U.S. PATENT DOCUMENTS

| 6,005,184 A | 12/1999 | Barnes |
| 7,592,536 B2 | 9/2009 | Glenn |

(Continued)

FOREIGN PATENT DOCUMENTS

| FR | 3043840 A1 | 5/2017 |
| JP | H11062146 | 3/1999 |

(Continued)

OTHER PUBLICATIONS

M Sankaran "On the Development of Solar Arrays For Insta 2A and 2B" The 28th Aerospace Mechanisms Symposium p. 17-34 (See N94-33291 09-15 ) (Year: 1995).*

(Continued)

*Primary Examiner* — Michael Y Sun
(74) *Attorney, Agent, or Firm* — MH2 TECHNOLOGY LAW GROUP, LLP

(57) ABSTRACT

A solar panel includes a substrate. The substrate includes a front portion and a back portion that are bonded together. The front portion includes an electrical insulation layer and a front face sheet layer that is bonded to the electrical insulation layer. The back portion includes a honeycomb core layer and a back face sheet layer that is bonded to the honeycomb core layer. A channel is defined in the honeycomb core layer. The solar panel also includes a first wire that is positioned at least partially in the channel.

13 Claims, 11 Drawing Sheets

(51) Int. Cl.

| | | |
|---|---|---|
| *H02S 50/10* | (2014.01) | |
| *B32B 3/12* | (2006.01) | |
| *B32B 3/20* | (2006.01) | |
| *B32B 37/18* | (2006.01) | |
| *B32B 41/00* | (2006.01) | |
| *H01L 31/05* | (2014.01) | |
| *H01L 31/18* | (2006.01) | |

(52) U.S. Cl.
CPC ....... *B32B 2041/04* (2013.01); *B32B 2305/34* (2013.01); *B32B 2307/202* (2013.01); *B32B 2307/206* (2013.01); *B32B 2457/12* (2013.01); *B32B 2605/08* (2013.01)

(56) References Cited

U.S. PATENT DOCUMENTS

| | | | | |
|---|---|---|---|---|
| 2002/0112419 | A1* | 8/2002 | Dorr | ............... H02S 20/23 52/173.3 |
| 2007/0074755 | A1* | 4/2007 | Eberspacher | ..... H01L 31/02013 136/244 |
| 2011/0061709 | A1 | 3/2011 | Payan | |
| 2014/0238468 | A1* | 8/2014 | Brounne | ............... H01L 31/048 136/251 |
| 2015/0007889 | A1 | 1/2015 | Buzoujima et al. | |
| 2017/0012163 | A1 | 1/2017 | Clevenger et al. | |

FOREIGN PATENT DOCUMENTS

| | | |
|---|---|---|
| JP | 2009032954 A | 2/2009 |
| WO | 2008/112985 A1 | 9/2008 |

OTHER PUBLICATIONS

Extended European Search Report dated Jul. 30, 2021 in corresponding European Applicaton No. 21174640.9, 7 pages.

Extended European Search Report dated Sep. 3, 2021 in corresponding European Application No. 21174635.9, 11 pages.

Sankaran et al., "On the Development of Solar Arrays for INSAT 2A & 2B," Proceedings of the European Space Power Conference, SN, SL, vol. 2, No. 4, Sep. 4, 1995, 649-652.

* cited by examiner

SOLAR PANEL AND METHOD FOR PRODUCING THE SOLAR PANEL

FIELD OF THE DISCLOSURE

The present disclosure is directed to a solar panel and a method for producing the solar panel. More particularly, the present disclosure is directed to populating a front portion of a substrate with cover glass interconnected cells (CICs) and/or wiring before bonding the front portion to a back portion of the substrate to produce the solar panel.

BACKGROUND

A solar panel includes a substrate. The substrate includes an electrical insulation layer, a first (e.g., front) face sheet layer, a honeycomb core layer, and a second (e.g., back) face sheet layer. In one example, the electrical insulation layer is bonded to the front face sheet layer to create a front portion of the substrate, and the honeycomb core layer is bonded to the back face sheet layer to create a back portion of the substrate. The front and back portions are then bonded together to complete the substrate. More particularly, the front face sheet is bonded to the honeycomb core to complete the substrate.

After the substrate is complete, CICs, which include solar cells with interconnects and cover glass, can be bonded to the substrate. More particularly, the CICs can be bonded to the electrical insulation layer. Wiring can also be bonded to the electrical insulation layer, the back face sheet layer, or both. The substrate, CICs, and wiring produce a solar panel.

However, when produced in this manner, it can be difficult to automate the process of bonding the CICs to the front face sheet layer with any sort of modularity/standardization. It can also be difficult to repair any faulty CICs.

SUMMARY

A solar panel is disclosed. The solar panel includes a substrate. The substrate includes a front portion and a back portion that are bonded together. The front portion includes an electrical insulation layer and a front face sheet layer that is bonded to the electrical insulation layer. The back portion includes a honeycomb core layer and a back face sheet layer that is bonded to the honeycomb core layer. A channel is defined in the honeycomb core layer. The solar panel also includes a first wire that is positioned at least partially in the channel.

A method for producing a solar panel is also disclosed. The method includes bonding an electrical insulation layer and a front face sheet layer together to produce a front portion of a substrate. The method also includes bonding a honeycomb core layer and a back face sheet layer to produce a back portion of the substrate. The method also includes forming a channel in the honeycomb core layer. The method also includes positioning a first wire at least partially in the channel. The method also includes bonding the front portion of the substrate and the back portion of the substrate together while the first wire is positioned at least partially in the channel.

In another implementation, the method includes producing a tile. Producing the tile includes bonding an electrical insulation layer and a front face sheet layer together to produce a front portion of a substrate. Producing the tile also includes bonding the front portion of the substrate and a cell together. Producing the tile also includes bonding the front portion of the substrate and a first wire together. The method also includes bonding a honeycomb core layer and a back face sheet layer to produce a back portion of the substrate. The method also includes forming a channel in the honeycomb core layer. The method also includes positioning the tile such that at least a portion of the first wire is positioned at least partially within the channel.

BRIEF DESCRIPTION OF THE DRAWINGS

The accompanying drawings, which are incorporated in and constitute a part of this specification, illustrate aspects of the present teachings and together with the description, serve to explain the principles of the present teachings.

Figure 1:
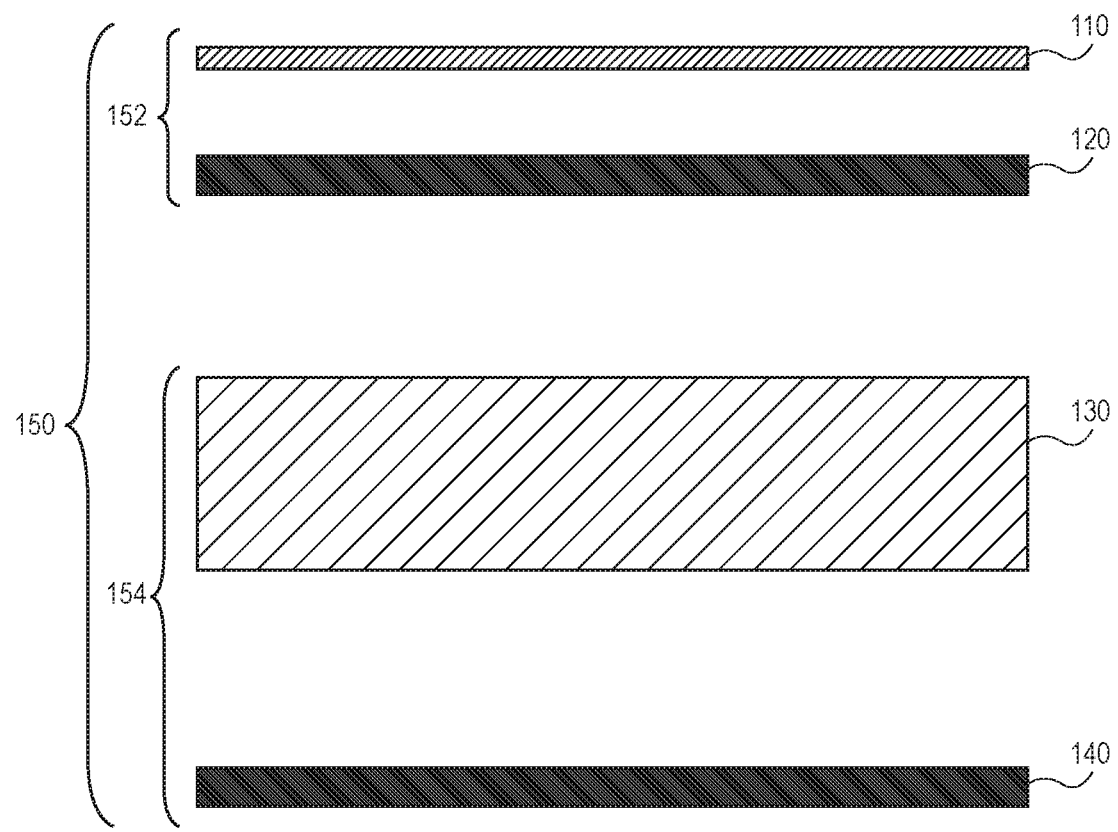
FIG. 1 illustrates a schematic view of a plurality of layers that are used to produce a substrate for a solar panel, according to an implementation.

It should be noted that some details of the figures have been simplified and are drawn to facilitate understanding rather than to maintain strict structural accuracy, detail, and scale.

DESCRIPTION

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

Bonding a Cell and a Wire to a Front Portion of a Substrate to Produce a Tile Prior to Bonding the Tile to a Back Portion of the Substrate The present disclosure is directed to a solar panel and a method for producing the solar panel. The solar panel can include a substrate, a cell (e.g., a CIC), a wire, or a combination thereof. The substrate can include a front portion and a back portion. The front portion can include an electrical insulation layer and a first (e.g., front) face sheet layer. The back portion can include a honeycomb core layer and a second (e.g., back) face sheet layer. The front portion of the substrate can have the cell, the wire, or both bonded thereto to produce a tile. After the tile is produced, the tile can be bonded to the back portion of the substrate to produce the solar panel.

The tiles and/or solar panels produced as described herein can be standardized and more easily mass-produced than conventional solar panel components and conventional solar panels. This allows improved modularity and the ability to make differently-sized solar panels with a variety of different configurations more easily than using conventional components and methods. In addition, the cells can be more easily repaired on the tiles when compared to cells bonded to current larger panels. Furthermore, the front face sheet layer described herein can be broken into multiple pieces, unlike in current solar panels.

FIG. 1 illustrates a schematic view of a plurality of layers (four are shown: 110, 120, 130, 140) that can be used to produce a substrate 150 for a solar panel 100, according to an implementation. The substrate 150 can include an electrical insulation layer 110. The electrical insulation layer 110 can be or include a polyimide. More particularly, the electrical insulation layer 110 can be or include poly (4,4'-oxydiphenylene-pyromellitimide). For example, the electrical insulation layer 110 can be or include Kapton® tape. The electrical insulation layer 110 can have a thickness from about 0.001 inches to about 0.005 inches.

The substrate 150 also includes a first (e.g., front) face sheet layer 120. The front face sheet layer 120 can be or include a polymer, carbon fibers, glass fibers, metal, or a combination thereof. More particularly, the front face sheet layer 120 can be or include a multiply carbon fiber reinforced polymer (CFRP) or a glass fiber reinforced polymer (GFRP). The front face sheet layer 120 can have a thickness from about 0.01 inches to about 0.06 inches. As discussed below, the electrical insulation layer 110 and the front face sheet layer 120 are bonded together to form a first (e.g., front) portion 152 of the substrate 150.

The substrate 150 also includes a honeycomb core layer 130. The honeycomb core layer 130 can be or include a vented metal. More particularly, the honeycomb core layer 130 can be or include a vented aluminum. The honeycomb core layer 130 can have a thickness from about 0.125 inches to about 5 inches. In one implementation, an isogrid can be used instead of or in addition to the honeycomb core layer 130. The isogrid can be or include a partially hollowed-out structure that is formed from a single metal plate. The isogrid can have triangular integral stiffening ribs (often called stringers).

The substrate 150 also includes a second (e.g., back) face sheet layer 140. The back face sheet layer 140 can be or include a polymer, carbon fibers, glass fibers, metal, or a combination thereof. More particularly, the back face sheet layer 140 can be or include a CFRP or a GFRP. The back face sheet layer 140 can have a thickness from about 0.01 inches to about 0.06 inches. As discussed below, the honeycomb core layer 130 and the back face sheet layer 140 can be bonded together to form a second (e.g., back) portion 154 of the substrate 150.

Figure 2:
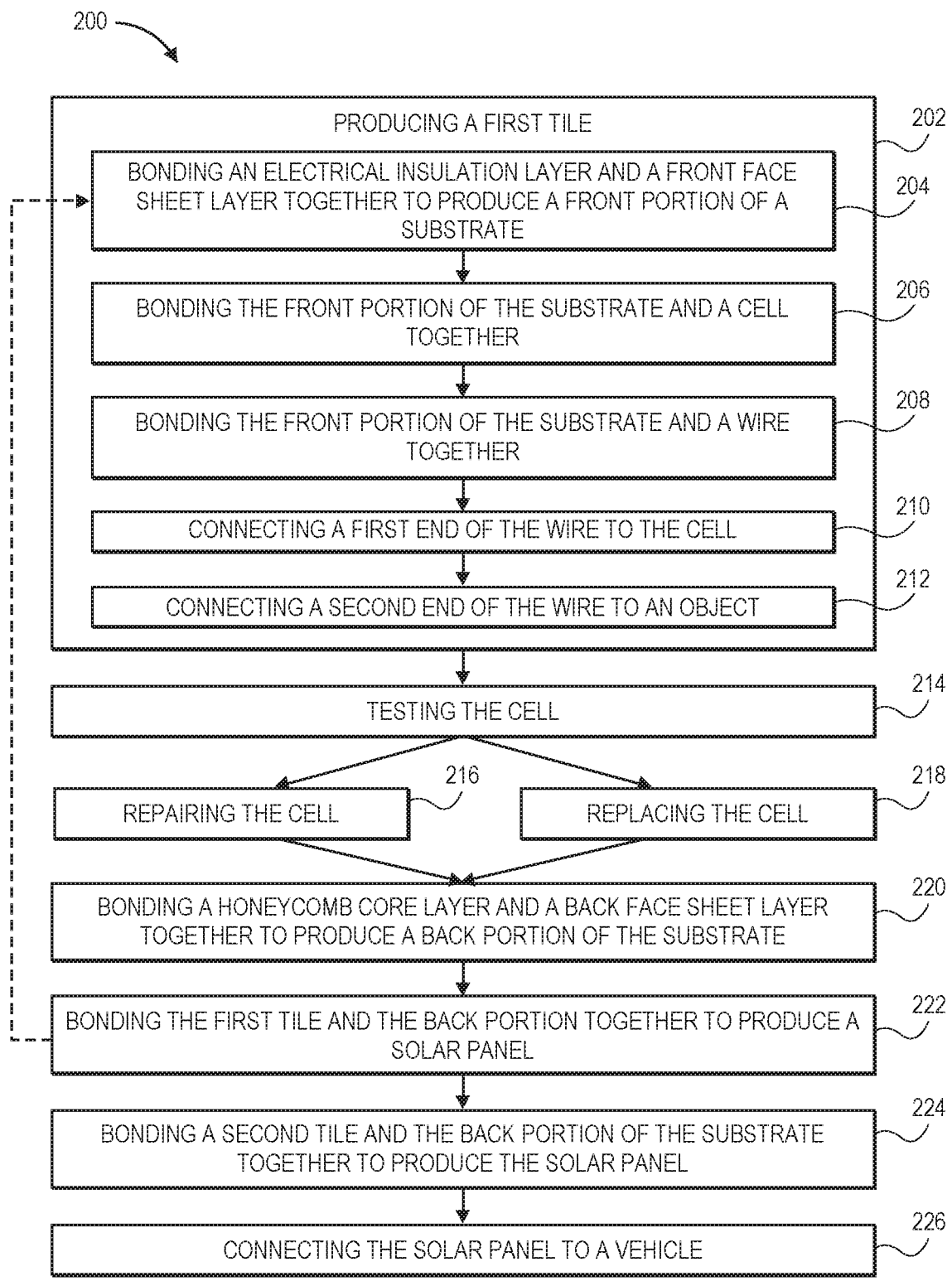
FIG. 2 illustrates a flowchart of a method for producing the solar panel, according to an implementation.

FIG. 2 illustrates a flowchart of a method 200 for producing the solar panel 100, according to an implementation. An illustrative order of the method 200 is provided below; however, one or more steps of the method 200 can be repeated, performed in a different order, or omitted altogether.

Figure 3:
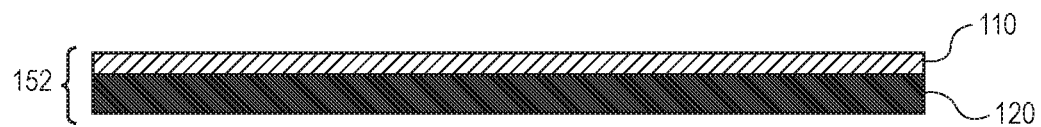
FIG. 3 illustrates a schematic view of an electrical insulation layer bonded to a front face sheet layer to produce a front portion of the substrate, according to an implementation.

The method 200 also includes producing a tile 156, as at 202. Producing the tile 156 can include bonding the electrical insulation layer 110 and the front face sheet layer 120 together to produce the front portion 152 of the substrate 150, as at 204. This is shown in FIG. 3. In an example, the electrical insulation layer 110 and the front face sheet layer 120 can be bonded together using a film adhesive such as FM300-2U.

Figure 4:
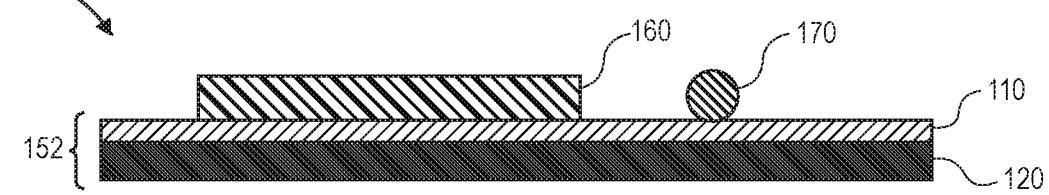
FIG. 4 illustrates a schematic view of a cell and a wire bonded to the front portion of the substrate to produce a tile, according to an implementation.

Producing the tile 156 also includes bonding the front portion 152 of the substrate 150 and a cell 160 together, as at 206. More particularly, this can include bonding the cell 160 to the electrical insulation layer 110 using an adhesive such as a room-temperature-vulcanizing (RTV) silicone. RTV silicone is a rubber polymer that dries at room temperature. This is shown in FIG. 4. Although a single cell 160 is shown, in other implementations, two or more cells can be bonded to the front portion 152 of the substrate 150 (e.g., the electrical insulation layer 110). The cell 160 can be or include a photovoltaic (PV) cell, which is also referred to as a solar cell. The cell 160 can be or include one or more cover glass interconnected cells (CICs) that include one or more PV/solar cells with interconnects and cover glass.

Producing the tile 156 also includes bonding the front portion 152 of the substrate 150 and a wire 170 together, as at 208. More particularly, this can include bonding the wire 170 to the electrical insulation layer 110 using an adhesive such as the RFV silicone. This is also shown in FIG. 4. Although a single wire 170 is shown, in other implementations, two or more wires can be bonded to the front portion 152 of the substrate 150 (e.g., the electrical insulation layer 110). As can be seen, the wire 170 may only be in contact with and/or bonded to the electrical insulation layer 110. In other implementations, the wire 170 can also or instead pass through the substrate 150 and be in contact with and/or bonded to the back face sheet layer 140. The tile 156, which is shown in FIG. 4, includes the front portion 152 of the substrate 150, the cell 160, the wire 170, or a combination thereof.

The method 200 also includes connecting a first end of the wire 170 to the cell 160, as at 210. This can be a sub-step of step 202 (e.g., similar to steps 204-208), or it can be a separate step in the method 200. For example, the wire 170 can be connected to the cell 160 before or after the cell 160 is bonded to the front portion 152 of the substrate 150 (e.g., the electrical insulation layer 110). The wire 170 can also or instead be connected to the cell 160 before or after the wire 170 is bonded to the front portion 152 of the substrate 150 (e.g., the electrical insulation layer 110).

The method 200 also includes connecting a second end of the wire 170 to an object, as at 212. This can be a sub-step of step 202 (e.g., similar to steps 204-208), or it can be a separate step in the method 200. For example, the wire 170 can be connected to the object before or after the wire 170 is bonded to the front portion 152 of the substrate 150 (e.g., the electrical insulation layer 110). The object can be or include another cell, a string, another tile, a solar panel, a vehicle (e.g., an aircraft), or the like.

The method 200 can also include testing the cell 160, as at 214. The cell 160 can be tested before or after the cell 160 is bonded to the front portion 152 of the substrate 150. The cell 160 can also or instead be tested before or after the tile 156 has been produced. The cell 160 can also or instead be tested before the tile 156 is bonded to the back portion 154 of the substrate 150, as described below. The cell 160 can be tested using a solar simulator. The cell 160 can also or instead be tested by forward biasing the cell 160. The cell 160 can be tested to determine if physical damage to the cell 160, if the connections to the cell 160 are robust or damaged, if the cell 160 meets a predetermined performance metric (e.g., generates a predetermined voltage and/or current), or a combination thereof.

The method 200 can also include repairing the cell 160 in response to the testing indicating that the cell 160 is malfunctioning, as at 216. The method 200 can also or instead include replacing the cell 160 with a second (e.g., replacement) cell in response to the testing indicating that the cell 160 is malfunctioning, as at 218. Replacing the cell 160 with the replacement cell can include removing the cell 160 from the front portion 152 of the substrate 150 (e.g., the electrical insulation layer 110), and subsequently bonding the replacement cell to the front portion 152 of the substrate 150 (e.g., the electrical insulation layer 110). The cell 160 can be repaired or replaced before or after the tile 156 has been produced. The cell 160 can also or instead be repaired or replaced with the replacement cell before the tile 156 is bonded to the back portion 154 of the substrate 150, as described below.

It is easier to repair and/or replace the cell 160 at the tile level before the solar panel is completed because the tile 156 is smaller and easier to handle than larger conventional components. Furthermore, because the tile 156 is smaller, the tile 156 can be discarded if malfunctioning, which would be much more wasteful with a larger conventional solar panel.

Figure 5:
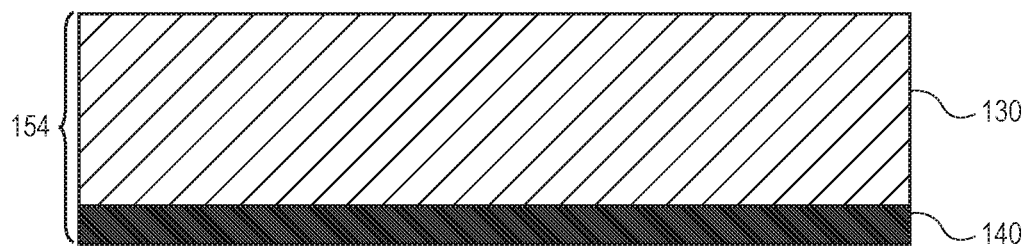
FIG. 5 illustrates a schematic view of a honeycomb core layer bonded to a back face sheet layer to produce a back portion of the substrate, according to an implementation.

The method 200 also includes bonding the honeycomb core layer 130 and the back face sheet layer 140 together to produce the back portion 154 of the substrate 150, as at 220. This is shown in FIG. 5. The honeycomb core layer 130 and the back face sheet layer 140 can be bonded together using a film adhesive such as FM300-2U. The honeycomb core layer 130 and the back face sheet layer 140 can be bonded together before or after the tile 156 is produced.

Figure 6:
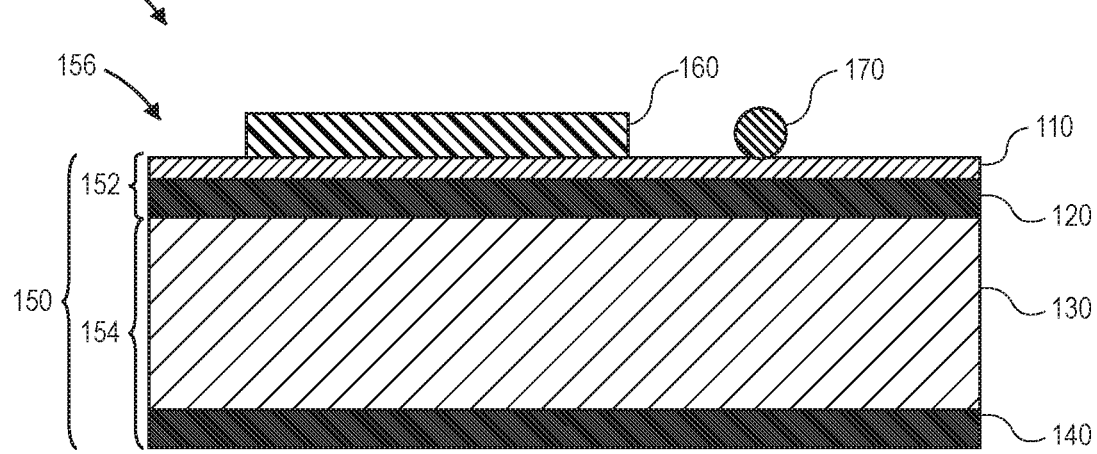
FIG. 6 illustrates an example of a solar panel including the tile bonded to the back portion of the substrate, according to an implementation.

The method 200 also includes bonding the tile 156 and the back portion 154 of the substrate 150 together to produce the solar panel 100, as at 222. This can include bonding the front portion 152 of the substrate 150 and the back portion 154 of the substrate 150 together. More particularly, the front face sheet layer 120 and the honeycomb core layer 130 can be bonded together using a film adhesive such as FM300-2U. This is shown in FIG. 6. Step 222 can take place after one or more (e.g., all) of the steps 202-220. For example, step 222 can take place after the cell 160 is bonded to the front portion 152 of the substrate 150 (as at 206), after the wire 170 is bonded to the front portion 152 of the substrate 150 (as at 208), or both.

As mentioned above, performing the method 200 in this manner (e.g., bonding the cell 160 and/or the wire 170 to the front portion 152 of the substrate 150 to produce the tile 156 prior to bonding the tile 156 to the back portion 154 of the substrate 150) can allow the tiles 156A and solar panels 100 to be standardized and more easily mass-produced than conventional solar panel components and conventional solar panels. This allows improved modularity and the ability to make differently-sized solar panels with a variety of different configurations more easily than using conventional components and methods. In addition, the cells can be more easily repaired on the tiles when compared to cells bonded to conventional larger panels. Furthermore, the front face sheet layer described herein may not be broken into multiple pieces, as in conventional solar panels.

In the implementation described above, the solar panel 100 can include a single tile 156 bonded to a single back portion 154 of the substrate 150 (e.g., a 1:1 ratio). In another implementation, the solar panel 100 can include a plurality of tiles bonded to a single back portion 154 of the substrate 150 (e.g., a 2:1 ratio, a 4:1 ratio, an 8:1 ratio, etc.). In this implementation, the method 200 can loop back around to step 202 to produce additional tiles 156 that are to be bonded to the back portion 154 of the substrate 150.

Figure 7:
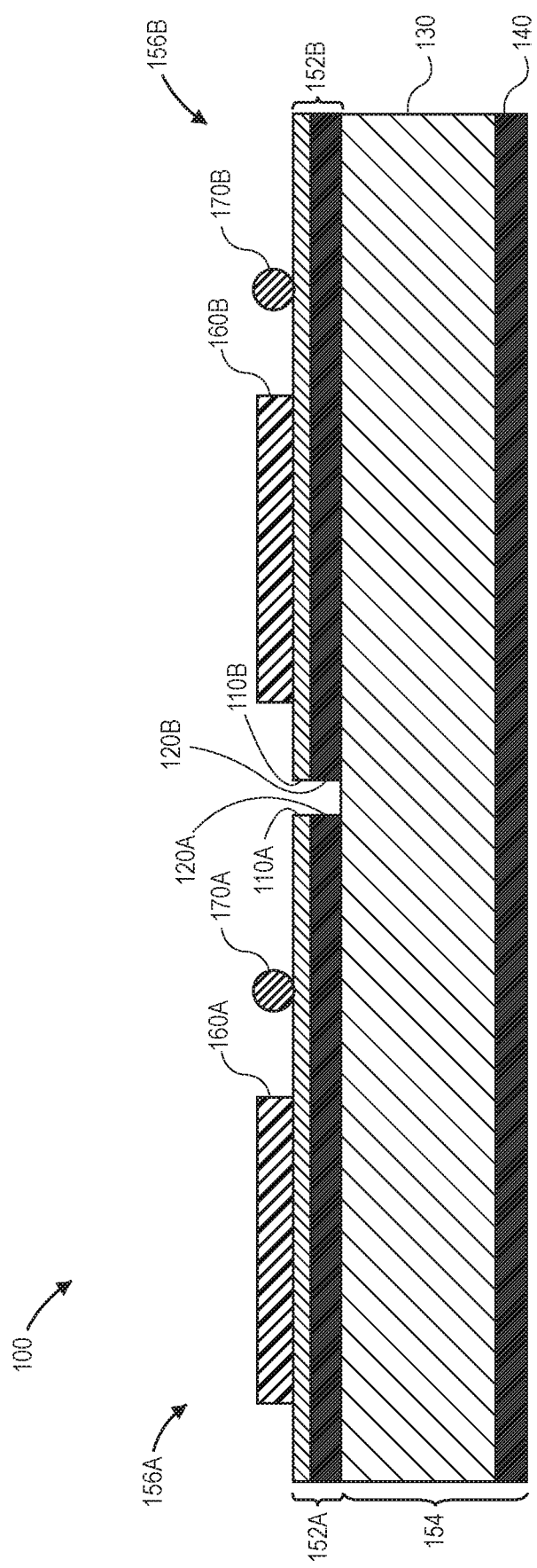
FIG. 7 illustrates another example of a solar panel including two tiles bonded to a single back portion of the substrate, according to an implementation.

The method 200 also includes bonding a second tile and the back portion 154 of the substrate 150 together to produce the solar panel 100, as at 224. FIG. 7 illustrates two tiles 156A, 156B bonded to a single back portion 154 of the substrate 150 to produce the solar panel 100, according to an implementation. Each tile 156A, 156B can include a front portion 152A, 152B, a cell 160A, 160B, a wire 170A, 170B, or a combination thereof. The tiles 156A, 156B can be positioned adjacent to one another (e.g., side-to-side or end-to-end) on the back portion 154 of the substrate 150. The first tile 156A can be connected to the second tile 156B. For example, the cell 160A and/or the wire 170A can be connected to the second tile 156B (e.g., the cell 160B and/or the wire 170B).

Bonding the two or more tiles 156A, 156B to a single back portion 154 makes producing and repairing the solar panel 100 easier because it can facilitate automation and standardization. For example, if one tile is faulty, it can be automatically be replaced with another working tile. In addition, the handling of the components used to make the solar panel 100 can be easier because the tiles 156A, 156B can be smaller than those used to produce conventional solar panels. The implementation with two or more tiles 156A, 156B can also include one or more (e.g., all) of the advantages described above.

In this implementation, the back portion 154 of the substrate 150 can have a greater surface area than each of the tiles 156A, 156B. In the example shown, surface area of the back portion 154 of the substrate 150 is about the same as the surface area of the two tiles 156A, 156B combined; however, in other examples, the back portion 154 of the substrate 150 can be sized to receive four tiles, six tiles, eight tiles, or more.

The method 200 can also include connecting the solar panel 100 to a vehicle, as at 226. More particularly, the solar panel 100 can be connected to an exterior of the vehicle. The vehicle can be or include a car, a bus, a train, a boat, an airplane, a helicopter, an unmanned aerial vehicle (UAV), a spacecraft, or the like.

Figure 8:
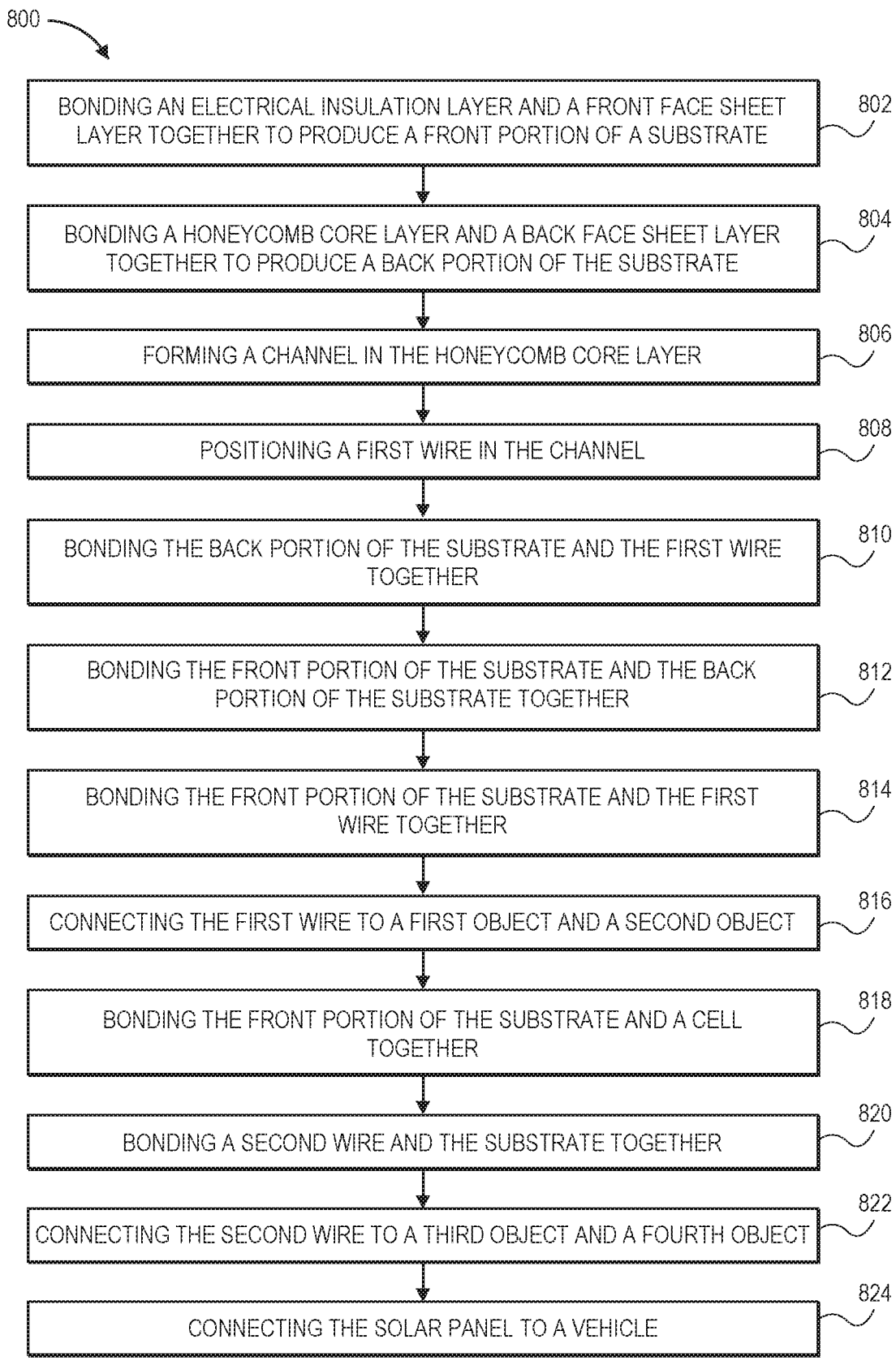
FIG. 8 illustrates a flowchart of another method for producing the solar panel, according to an implementation.

Positioning the Wire in a Channel in the Honeycomb Core Layer Before the Front Portion of the Substrate is Bonded to the Back Portion of the Substrate FIG. 8 illustrates a flowchart of another method 800 for producing the solar panel 100, according to an implementation. An illustrative order of the method 800 is provided below; however, one or more steps of the method 800 can be performed in a different order, repeated, or omitted altogether.

The method 800 includes bonding the electrical insulation layer 110 and the front face sheet layer 120 together to produce the front portion 152 of the substrate 150, as at 802. This is shown in FIG. 3. The electrical insulation layer 110 and the front face sheet layer 120 can be bonded together using a film adhesive such as FM300-2U.

The method 800 also includes bonding the honeycomb core layer 130 and the back face sheet layer 140 together to produce the back portion 154 of the substrate 150, as at 804. This is shown in FIG. 5. The honeycomb core layer 130 and the back face sheet layer 140 can be bonded together using a film adhesive such as FM300-2U.

Figure 9:
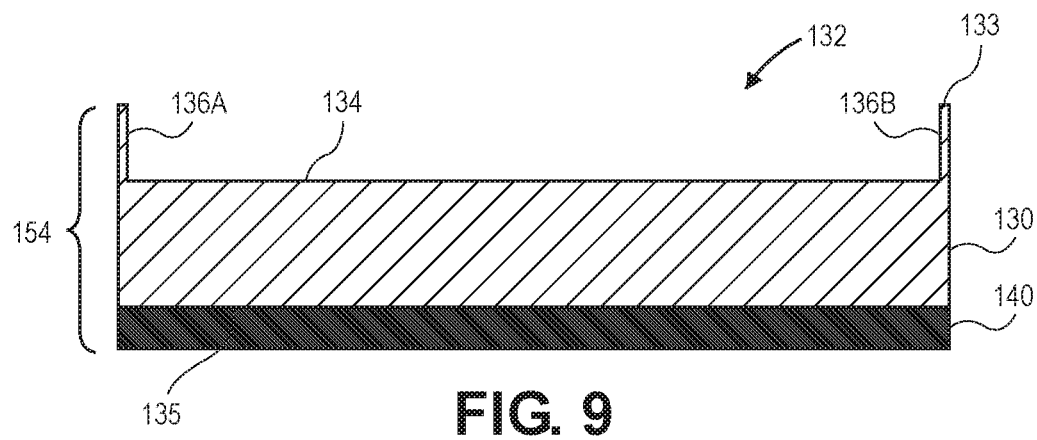
FIG. 9 illustrates a schematic view of a channel formed in the honeycomb core layer of the back portion of the substrate, according to an implementation.

The method 800 also includes forming one or more channels (one is shown: 132) in the honeycomb core layer 130, as at 806. This is shown in FIG. 9. The channel 132 can be formed in the honeycomb core layer 130 before or after the honeycomb core layer 130 is bonded to the back face sheet layer 140. In one implementation, the channel 132 can be formed by removing a portion of the honeycomb core layer 130 (e.g., by machining). In another implementation, the channel 132 can be formed during the formation of the honeycomb core layer 130. For example, the mold that produces the honeycomb core layer 130 can form the channel 132 in the honeycomb core layer 130.

As shown, the channel 132 can be or include a recess formed at least partially in an inner surface 133 of the honeycomb core layer 130. The channel 132 can be at least partially defined by one or more channel boundary portions (two are shown: 136A, 136B) and a reduced inner surface 134 of the honeycomb core layer 130. In an example, the channel boundary portions 136A, 136B can be or include portions of the honeycomb core layer 130 that are not removed when the channel 132 is formed.

In another implementation, the channel 132 can be or include a recess formed at least partially in an outer surface 135 of the honeycomb core layer 130. In yet another implementation, the channel 132 can be or include a bore formed at least partially through the honeycomb core layer 130 (e.g., between the inner surface 133 and the outer surface 135. As used herein, the inner surface 133 is the surface that is/will be bonded to the front portion 152 of the substrate 150 (e.g., the front face sheet layer 120), and the outer surface 135 is the surface that is/will be bonded to the back face sheet layer 140.

Figure 10:
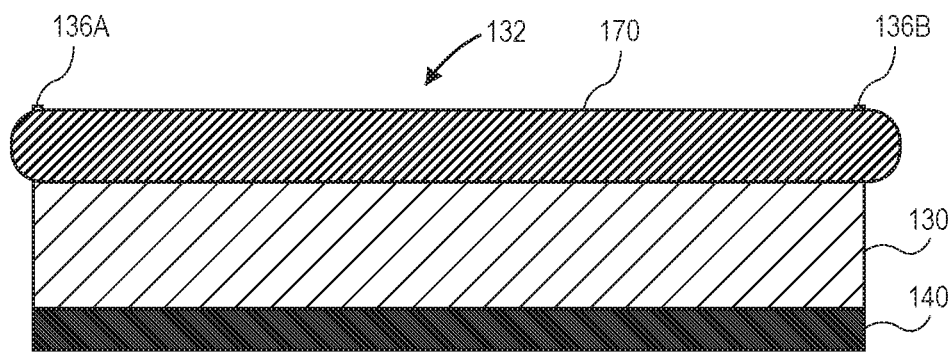
FIG. 10 illustrates a first wire positioned at least partially in the channel, according to an implementation.

The method 800 also includes positioning a first wire 170 in the channel 132, as at 808. This is shown in FIG. 10. As mentioned above, although a single first wire 170 is shown, the first wire 170 can also or instead include two or more wires. A thickness of the first wire 170 can be less than or equal to a depth of the channel 132.

In one implementation, the method 800 also includes bonding the back portion 154 of the substrate 150 and the first wire 170 together, as at 810. More particularly, once the first wire 170 is positioned within the channel 132, the first wire 170 can be bonded to the honeycomb core layer 130. For example, the first wire 170 can be bonded to the reduced inner surface 134 and/or the channel boundary portions 136A, 136B of the honeycomb core layer 130 using an adhesive such as the RFV silicone. In another implementation, step 810 can be omitted.

Figure 11:
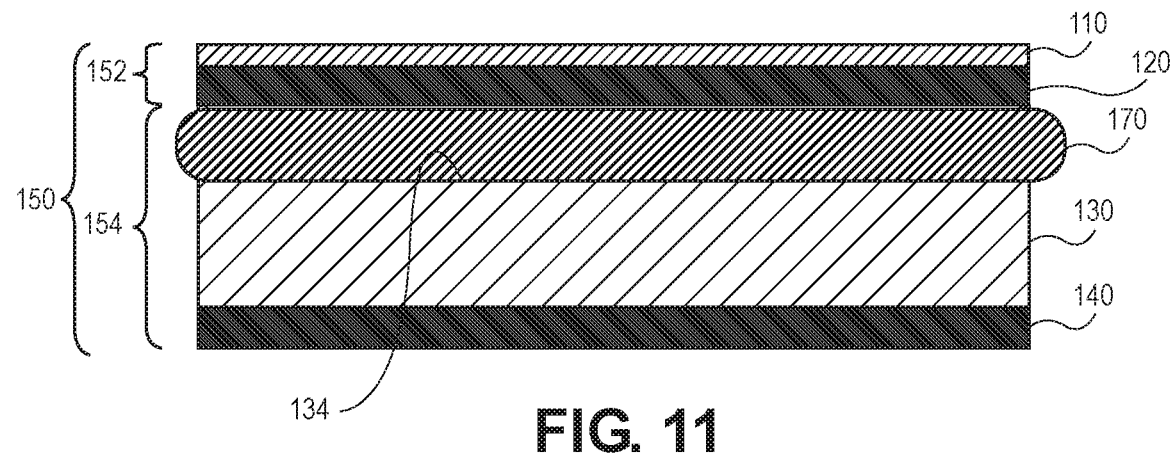
FIG. 11 illustrates a schematic view of the front and back portions of the substrate bonded together with the first wire positioned at least partially in the channel, according to an implementation.

The method 800 also includes bonding the front portion 152 of the substrate 150 and the back portion 154 of the substrate 150 together, as at 812. This is shown in FIG. 11. As mentioned above, the front portion 152 and the back portion 154 together produce the substrate 150. The front portion 152 and the back portion 154 can be bonded together using a film adhesive such as FM300-2U. Bonding the front portion 152 and the back portion 154 together can include bonding the front face sheet layer 120 to the channel boundary portions 136A, 136B of the honeycomb core layer 130. In one implementation, a gap can exist between the front face sheet layer 120 and the first wire 170. In another implementation, the first wire 170 can be compressed between the front face sheet layer 120 and the reduced inner surface 134 of the honeycomb core layer 130.

Step 812 can take place after the channel 132 is formed and/or after the first wire 170 is positioned in the channel 132. As shown, the first wire 170 can be positioned at least partially between the front face sheet layer 120 and the reduced inner surface 134 of the honeycomb core layer 130. At least a portion of the first wire 170 can also be positioned at least partially between the channel boundary portions 136A, 136B. In one implementation, the wire 170 can enter the channel 132 on one side of the substrate 150 and exit the channel 132 on the other side of the substrate 150. In another implementation, at least a portion of the first wire 170 can extend through or beyond openings in the channel boundary portions 136A, 136B.

The method 800 also includes bonding the front portion 152 of the substrate 150 and the first wire 170 together, as at 814. More particularly, the front face sheet layer 120 and the first wire 170 can be bonded together before, simultaneously with, or after the front portion 152 of the substrate 150 and the back portion 154 of the substrate 150 are bonded together. The first wire 170 can be bonded to the front face sheet layer 120 using an adhesive such as the RFV silicone. In another implementation, step 814 can be omitted, and the first wire 170 can instead be secured in place by its positioning in the channel 132 between the front face sheet layer 120 and the honeycomb core layer 130.

The method 800 also includes connecting the first wire 170 to a first object and a second object, as at 816. The first object can be or include the cell 160, another cell, a string of cells, a tile, the solar panel 100, or a combination thereof. The second object can be or include another cell (e.g., not cell 160), a string of cells (e.g., including the cell 160), the solar panel 100, the vehicle, or a combination thereof. The first wire 170 can be connected to the first and second objects before or after the first wire 170 is placed in the channel 132. The first wire 170 can be connected to the first and second objects before or after the first wire 170 is bonded to the back portion 154 of the substrate 150.

Figure 12:
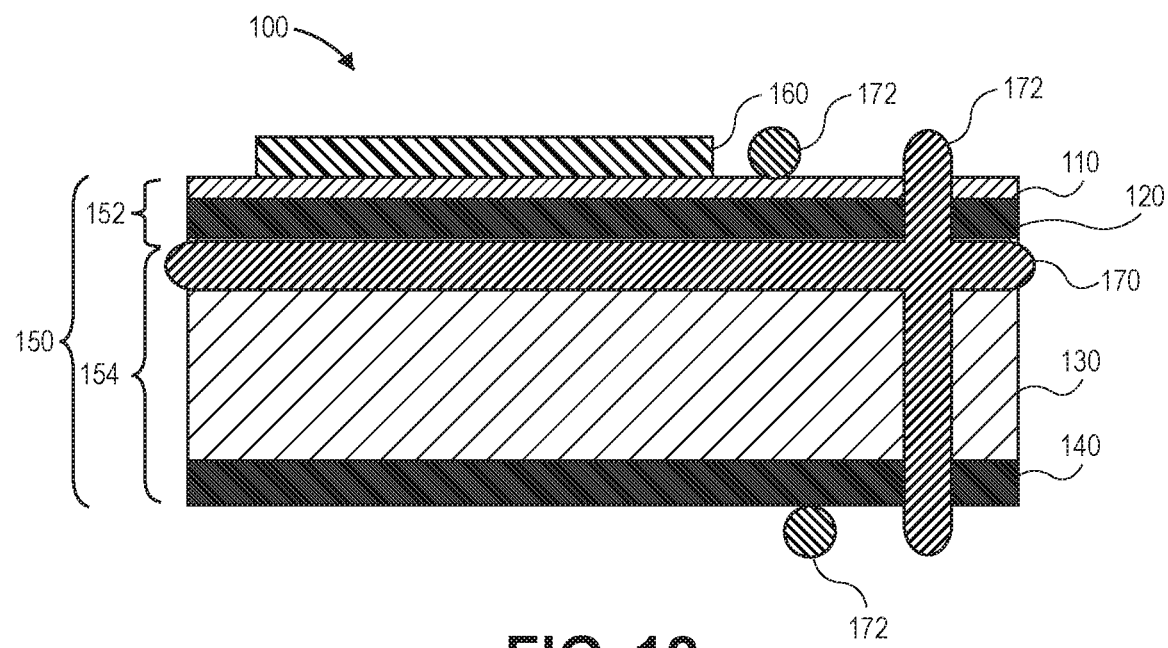
FIG. 12 illustrates a schematic view of a cell and a second wire bonded to the substrate of FIG. 11 to form a solar panel, according to an implementation.

The method 800 also includes bonding the front portion 152 of the substrate 150 and a cell 160 together, as at 818. This is shown in FIG. 12. More particularly, the cell 160 can be bonded to the electrical insulation layer 110 using an adhesive such as a room-temperature-vulcanizing (RTV) silicone. Although a single cell 160 is shown, in other implementations, two or more cells can be bonded to the front portion 152 of the substrate 150 (e.g., the electrical insulation layer 110). As mentioned above, the cell 160 can be or include a photovoltaic (PV) cell, which is also referred to as a solar cell. The cell 160 can be or include one or more cover glass interconnected cells (CICs) that include one or more PV/solar cells with interconnects and cover glass.

Step 818 can take place before or after the electrical insulation layer 110 is bonded to the front face sheet layer 120 to produce the front portion 152 of the substrate. Step 818 can instead take place before or after the front portion 152 of the substrate 150 is bonded to the back portion 154 of the substrate 150 to produce the substrate 150.

The method 800 also includes bonding a second wire 172 and the substrate 150 together, as at 820. This is also shown in FIG. 12. As mentioned above, although a single second wire 172 is shown, the second wire 172 can also or instead include two or more wires. The first wire 170 and the second wire 172 can be different wires or different portions (e.g., a first portion and a second portion) of the same wire.

The second wire 172 can be bonded to the substrate 150 using an adhesive such as the RFV silicone. The second wire 172 can be bonded to the electrical insulation layer 110, the back face sheet layer 140, or both. As shown, at least a portion of the first wire 170 can extend in a first direction that is substantially parallel with the layers 110, 120, 130, 140, and at least a portion of the second wire 172 can extend in a second direction that is substantially perpendicular with the layers 110, 120, 130, 140. For example, the second wire 172 can be wrapped at least partially around the substrate 150. In another example, at least a portion of the second wire 172 can extend through a hole formed (e.g., drilled) in the substrate 150.

The method 800 also includes connecting the second wire 172 to a third object and a fourth object, as at 822. In an implementation, the third object can be the same as the first object and/or the second object. In another implementation, the third object can be different than the first object and the second object. In an implementation, the fourth object can be the same as the first object, the second object, the third object, or a combination thereof. In another implementation, the fourth object can be different than the first object, the second object, and the third object. The third object can be or include the cell 160, another cell, a string of cells, a tile, the solar panel 100, or a combination thereof. The fourth object can be or include another cell (e.g., not cell 160), a string of cells (e.g., including the cell 160), the solar panel 100, the vehicle, or a combination thereof. The second wire 172 can be connected to the third and fourth objects before or after the second wire 172 is bonded to the substrate 150.

The substrate 150, the cell 160, the first wire 170, the second wire 172, or a combination thereof can produce the solar panel 100, which is shown in FIG. 12. The method 800 also includes connecting the solar panel 100 to a vehicle, as at 824. More particularly, the solar panel 100 can be connected to an exterior of the vehicle. The vehicle can be or include a car, a bus, a train, a boat, an airplane, a helicopter, an unmanned aerial vehicle (UAV), a spacecraft, or the like.

Positioning the first wire 170 in the channel 132 can reduce the thickness of the solar panel 100. More particularly, this can reduce the profile on the back side of the substrate 150. Positioning the first wire 170 in the channel 132 can also or instead increase the flexibility in the routing of the first wire 170 because the channel 132 and the first wire 170 can be routed in any manner and/or direction. In contrast, in a conventional solar panel, there are obstructions on the front side and back side (e.g., solar cells, other wires, snubbers, stay-out zones) around which the wire is routed. Positioning the first wire 170 in the channel 132 can also or instead reduce the amount of labor required to route the first wire 170 and/or secure the first wire 170 in place because there would be no need to spot bond the first wire 170 as frequently (e.g., every 5 inches or so) to hold the first wire 170 in place. The channel already exists so it routs the first wire 170. Thus, the amount of bonding between the first wire 170 and the substrate 150 can be reduced (e.g., less than conventional counterparts), or the bonding can be omitted. Another advantage is that, when used in conjunction of the tile method, there wouldn't need to be any wiring on the front portion 152 of the substrate 150, which allows a higher density of cells (e.g., cells 160). This increases efficiency and makes the whole tile concept easier to use. Another benefit is that the use of the channel 132 reduces or eliminates the need to drill any feedthrough holes through the substrate 150, resulting in less labor. In addition, when the first wire 170 is inside the channel 132 in the substrate 150, the first wire 170 is better protected and thus less likely to get damaged. This protection is relevant for mission assurance in spacecrafts, making it less likely that a small micro meteorite might damage the first wire 170 and cause reduced performance.

Figure 13:
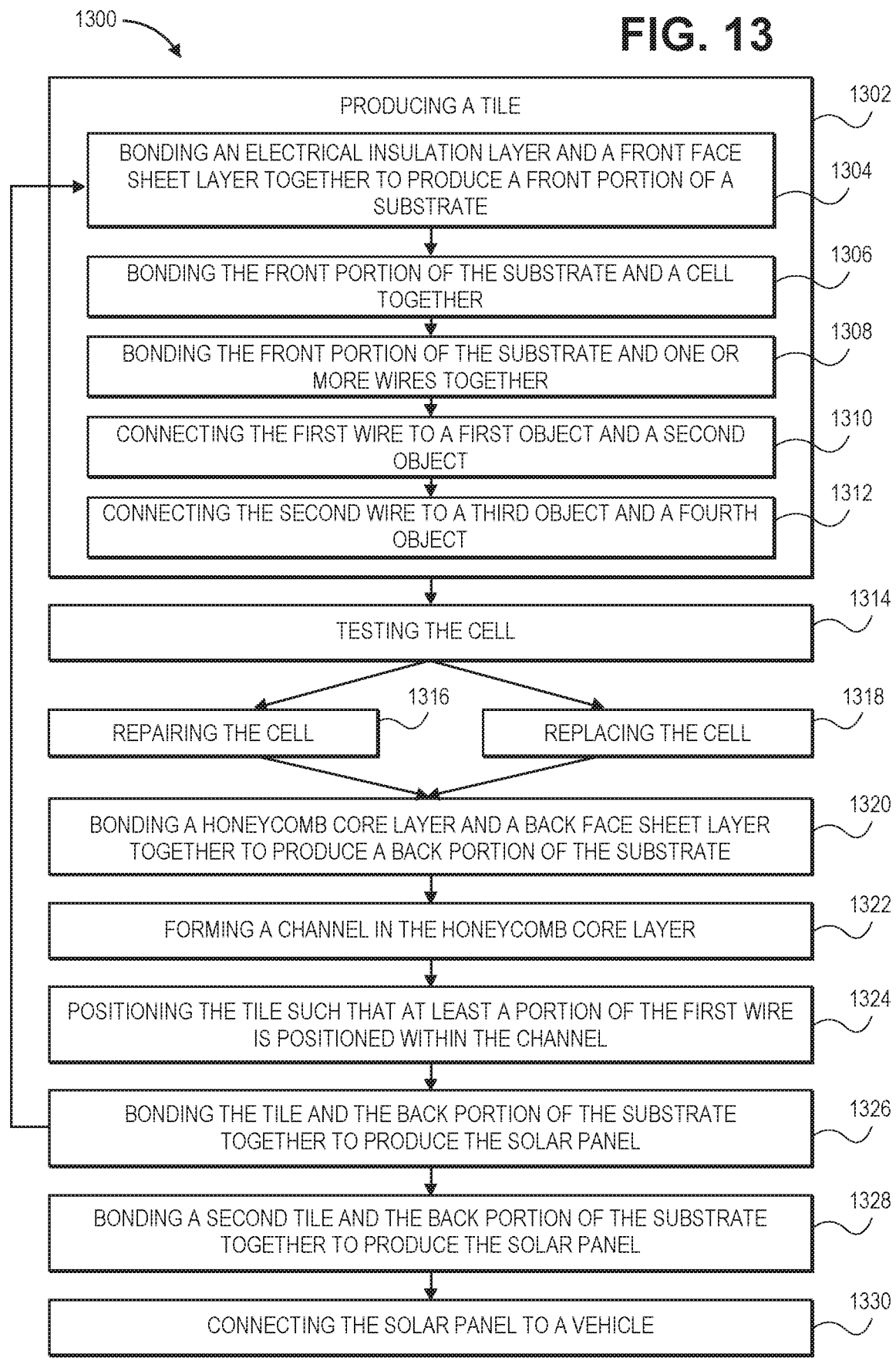
FIG. 13 illustrates a flowchart of yet another method for producing the solar panel, according to an implementation.

Bonding the Wire to the Front Portion of the Substrate Before Positioning the Wire in a Channel in the Honeycomb Core Layer FIG. 13 illustrates a flowchart of another method 1300 for producing the solar panel 100, according to an implementation. An illustrative order of the method 1300 is provided below; however, one or more steps of the method 1300 can be performed in a different order, repeated, or omitted altogether.

The method 1300 includes producing a tile 156, as at 1302. Producing the tile 156 can include bonding the electrical insulation layer 110 and the front face sheet layer 120 together to produce the front portion 152 of the substrate 150, as at 1304. This is shown in FIG. 3. The electrical insulation layer 110 and the front face sheet layer 120 can be bonded together using a film adhesive such as FM300-2U.

Figure 14:
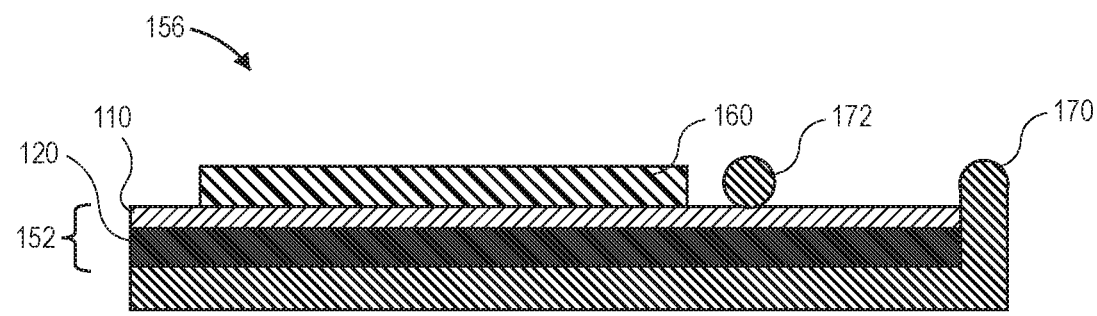
FIG. 14 illustrates a schematic view of a tile with a wire bonded to the front face sheet layer, according to an implementation.

Producing the tile 156 also includes bonding the front portion 152 of the substrate 150 and a cell 160 together, as at 1306. More particularly, this can include bonding the cell 160 to the electrical insulation layer 110 using an adhesive such as a room-temperature-vulcanizing (RTV) silicone. This is shown in FIG. 14. Although a single cell 160 is shown, in other implementations, two or more cells can be bonded to the front portion 152 of the substrate 150 (e.g., the electrical insulation layer 110). As mentioned above, the cell 160 can be or include a photovoltaic (PV) cell, which is also referred to as a solar cell. The cell 160 can be or include one or more cover glass interconnected cells (CICs) that include one or more PV/solar cells with interconnects and cover glass.

Producing the tile 156 also includes bonding the front portion 152 of the substrate 150 and one or more wires together (two wires shown: first wire 170 and second wire 172), as at 1308. This is also shown in FIG. 14. More particularly, this can include bonding the first wire 170 to the electrical insulation layer 110 and/or the front face sheet layer 120. This can also or instead include bonding the second wire 172 to the electrical insulation layer 110 and/or the front face sheet layer 120. The tile 156, which is shown in FIG. 14, includes the front portion 152 of the substrate 150, the cell 160, the first wire 170, the second wire 172, or a combination thereof.

The method 1300 also includes connecting the first wire 170 to a first object and a second object, as at 1310. This can be a sub-step of step 1302 (e.g., similar to steps 1304-1308), or it can be a separate step in the method 1300. The first object can be or include the cell 160, another cell, a string of cells, the tile 156, the solar panel 100, or a combination thereof. For example, the first wire 170 can be connected to the cell 160 (or a string of cells including the cell 160) before or after the cell 160 is bonded to the front portion 152 of the substrate 150. The first wire 170 can also or instead be connected to the cell 160 (or a string of cells including the cell 160) before or after the wire 170 is bonded to the front portion 152 of the substrate 150. The second object can be or include the cell 160, another cell (e.g., not cell 160), a string of cells (e.g., including the cell 160), the tile 156, the solar panel 100, the vehicle, or a combination thereof.

The method 1300 also includes connecting the second wire 172 to a third object and a fourth object, as at 1312. This can be a sub-step of step 1302 (e.g., similar to steps 1304-1308), or it can be a separate step in the method 1300. In an implementation, the third object can be the same as the first object and/or the second object. In another implementation, the third object can be different than the first object and the second object. In an implementation, the fourth object can be the same as the first object, the second object, the third object, or a combination thereof. In another implementation, the fourth object can be different than the first object, the second object, and the third object. The third object can be or include the cell 160, another cell, a string of cells (including the cell 160), the tile 156, the solar panel 100, or a combination thereof. The fourth object can be or include the cell 160, another cell (e.g., not cell 160), a string of cells (e.g., including the cell 160), the tile 156, the solar panel 100, the vehicle, or a combination thereof. For example, the second wire 172 can be connected to the third object and/or the fourth object before or after the second wire 172 is bonded to the front portion 152 of the substrate 150.

The method 1300 also includes testing the cell 160, as at 1314. The cell 160 can be tested before or after the cell 160 is bonded to the front portion 152 of the substrate 150. The cell 160 can also or instead be tested before or after the tile 156 has been produced. The cell 160 can also or instead be tested before or after the first wire 170 is positioned in the channel 132, as described below. The cell 160 can also or instead be tested before the tile 156 is bonded to the back portion 154 of the substrate 150, as described below. The cell 160 can be tested using a solar simulator. The cell 160 can also or instead be tested by forward biasing the cell 160. The cell 160 can be tested to determine if physical damage to the cell 160, if the connections to the cell 160 are robust or damaged, if the cell 160 meets a predetermined performance metric (e.g., generates a predetermined voltage and/or current), or a combination thereof.

The method 1300 also includes repairing the cell 160 in response to the testing indicating that the cell 160 is malfunctioning, as at 1316. The method 200 can also or instead include replacing the cell 160 with a second (e.g., replacement) cell in response to the testing indicating that the cell 160 is malfunctioning, as at 1318. Replacing the cell 160 with the replacement cell can include removing the cell 160 from the front portion 152 of the substrate 150 (e.g., the electrical insulation layer 110), and subsequently bonding the replacement cell to the front portion 152 of the substrate 150 (e.g., the electrical insulation layer 110). The cell 160 can be repaired or replaced before or after the tile 156 has been produced. The cell 160 can also or instead be repaired or replaced before the tile 156 is bonded to the back portion 154 of the substrate 150, as described below.

It is easier to repair and/or replace the cell 160 at the tile level before the solar panel is completed because the tile 156 is smaller and easier to handle than larger conventional components. Furthermore, because the tile 156 is smaller, the tile 156 can be discarded if malfunctioning, which would be much more wasteful with a larger conventional solar panel.

The method 1300 also includes bonding the honeycomb core layer 130 and the back face sheet layer 140 together to produce the back portion 154 of the substrate 150, as at 1320. This is shown in FIG. 5. The honeycomb core layer 130 and the back face sheet layer 140 can be bonded together using a film adhesive such as FM300-2U. The honeycomb core layer 130 and the back face sheet layer 140 can be bonded together before or after the tile 156 is produced.

The method 1300 also includes forming one or more channels (one is shown: 132) in the honeycomb core layer 130, as at 1322. This is shown in FIG. 9. The channel 132 can be formed in the honeycomb core layer 130 before or after the honeycomb core layer 130 is bonded to the back face sheet layer 140. In one implementation, the channel 132 can be formed by removing a portion of the honeycomb core layer 130 (e.g., by machining). In another implementation, the channel 132 can be formed during the formation of the honeycomb core layer 130. For example, the mold that produces the honeycomb core layer 130 can form the channel 132 in the honeycomb core layer 130.

As shown, the channel 132 can be or include a recess formed at least partially in an inner surface 133 of the honeycomb core layer 130. The channel 132 can be at least partially defined by one or more channel boundary portions (two are shown: 136A, 136B) and a reduced inner surface 134 of the honeycomb core layer 130. In an example, the channel boundary portions 136A, 136B can be or include portions of the honeycomb core layer 130 that are not removed when the channel 132 is formed.

In another implementation, the channel 132 can be or include a recess formed at least partially in an outer surface 135 of the honeycomb core layer 130. In yet another implementation, the channel 132 can be or include a bore formed at least partially through the honeycomb core layer 130 (e.g., between the inner surface 133 and the outer surface 135. As used herein, the inner surface 133 is the surface that is/will be bonded to the front portion 152 (e.g., the front face sheet layer 120), and the outer surface 135 is the surface that is/will be bonded to the back face sheet layer 140.

Figure 15:
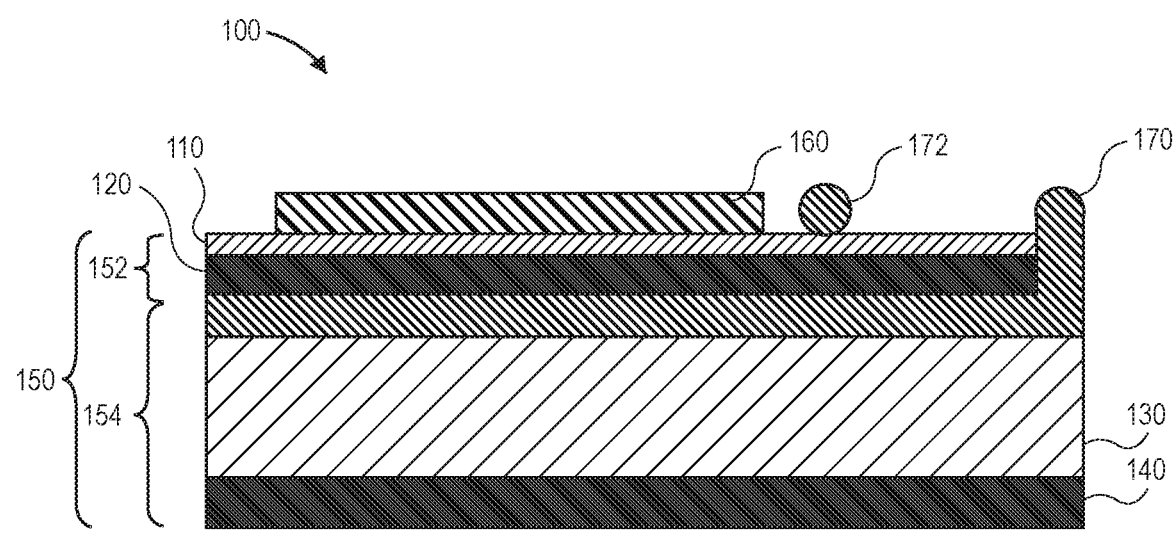
FIG. 15 illustrates a schematic view of the tile of FIG. 14 bonded to the back portion of the substrate to form a solar panel, according to an implementation.

The method 1300 also includes positioning the tile 156 such that at least a portion of the first wire 170 is positioned at least partially within the channel 132, as at 1324. This is shown in FIG. 15. More particularly, the tile 156 can be positioned such that the front face sheet layer 120 faces toward the back portion 154 of the substrate 150 and the electrical insulation layer 110 faces away from the back portion 154 of the substrate 150. The tile 156 and the back portion 154 of the substrate 150 can then be moved together until the front face sheet layer 120 contacts the honeycomb core layer 130 (e.g., one or more of the channel boundary portions 136A, 136B). At this point, at least a portion of the first wire 170 can be positioned at least partially within the channel 132.

The method 200 also includes bonding the tile 156 and the back portion 154 of the substrate 150 together to produce the solar panel 100, as at 1326. This is also shown in FIG. 15. This can include bonding the front portion 152 of the substrate 150 and the back portion 154 of the substrate 150 together using a film adhesive such as FM300-2U. More particularly, this can include bonding the front face sheet layer 120 and the channel boundary portions 136A, 136B of the honeycomb core layer 130 together.

Performing the method 1300 in this manner (e.g., producing the tile 156 and positioning the tile 156 such that the first wire 170 is positioned in the channel 132) can reduce the thickness of the solar panel 100. More particularly, this can reduce the profile on the back side of the substrate 150. Performing the method 1300 in this manner can also or instead increase the flexibility in the routing of the first wire 170 because the channel 132 and the first wire 170 can be routed in any manner and/or direction. In contrast, in a conventional solar panel, there are obstructions on the front side and back side (e.g., solar cells, other wires, snubbers, stay-out zones) around which the wire is routed. Performing the method 1300 in this manner can also or instead reduce the amount of labor required to route the first wire 170 and/or secure the first wire 170 in place because there would be no need to spot bond the first wire 170 as frequently (e.g., every 5 inches or so) to hold the first wire 170 in place. The channel already exists so it routs the first wire 170. Thus, the amount of bonding between the first wire 170 and the substrate 150 can be reduced (e.g., less than conventional counterparts), or the bonding can be omitted. Another advantage is that there can be a reduced amount of wiring on the front portion 152 of the substrate 150, which allows a higher density of cells (e.g., cells 160). This increases efficiency and makes the whole tile concept easier to use. Another benefit is that the use of the channel 132 reduces or eliminates the need to drill any feedthrough holes through the substrate 150, resulting in less labor. In addition, when the first wire 170 is inside the channel 132 in the substrate 150, the first wire 170 is better protected and thus less likely to get damaged. This protection is relevant for mission assurance in spacecrafts, making it less likely that a small micro meteorite might damage the first wire 170 and cause reduced performance.

In the implementation of the method 1300 described above, the solar panel 100 can include a single tile 156 bonded to a single back portion 154 of the substrate 150 (e.g., a 1:1 ratio). In another implementation, the solar panel 100 can include a plurality of tiles bonded to a single back portion 154 of the substrate 150 (e.g., a 2:1 ratio, a 4:1 ratio, an 8:1 ratio, etc.). In this implementation, the method 1300 can loop back around to step 1302 to produce additional tiles 156.

Figure 16:
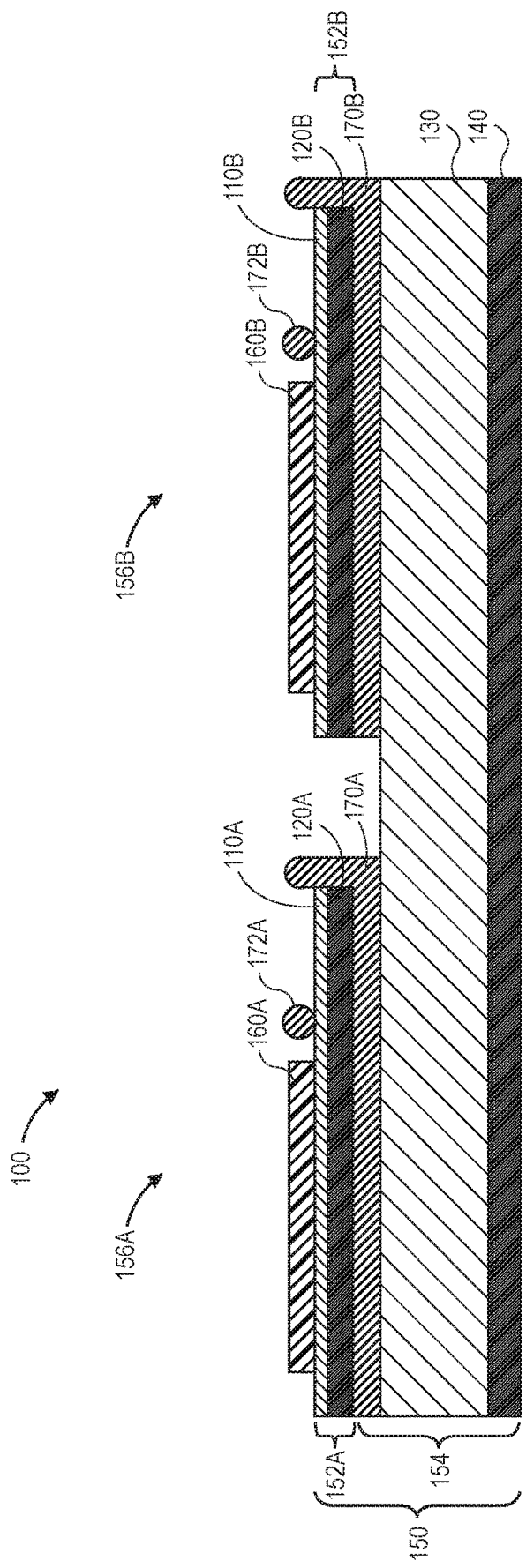
FIG. 16 another example of the solar panel of FIG. 15 including two tiles bonded to a single back portion of the substrate, according to an implementation.

The method 1300 also includes bonding a second tile and the back portion 154 of the substrate 150 together to produce the solar panel 100, as at 1328. FIG. 16 illustrates two tiles 156A, 156B bonded to a single back portion 154 of the substrate 150 to produce the solar panel 100, according to an implementation. Each tile 156A, 156B can include a front portion 152A, 152B, a cell 160A, 160B, a first wire 170A, 170B, a second wire 172A, 172B, or a combination thereof. The tiles 156A, 156B can be positioned adjacent to one another (e.g., side-to-side or end-to-end) on the back portion 154 of the substrate 150. In one implementation, the tiles 156A, 156B can be connected together using the first wire(s) 170A, 170B, the second wire(s) 172A, 172B, or a combination thereof to form a string of tiles. In another implementation, the tiles 156A, 156B can instead be connected together using metal strips instead of wiring to form a string of tiles. The tiles 156A, 156B can be connected to form the string before the first wire(s) 170A, 170B is/are positioned within the channel(s) (e.g., as at step 324). The strings can be connected to the vehicle.

Bonding the two or more tiles 156A, 156B to a single back portion 154 can make producing and repairing the solar panel 100 easier because it can facilitate automation and standardization. In addition, the handling of the components used to make the solar panel 100 can be easier because the tiles 156A, 156B can be smaller than those used to produce conventional solar panels.

In this implementation, the back portion 154 of the substrate 150 can have a greater surface area than each of the tiles 156A, 156B. In the example shown, surface area of the back portion 154 of the substrate 150 is about the same as the surface area of the two tiles 156A, 156B combined; however, in other examples, the back portion 154 of the substrate 150 can be sized to receive four tiles, six tiles, eight tiles, or more.

The method 1300 also includes connecting the solar panel 100 to a vehicle, as at 1330. More particularly, the solar panel 100 can be connected to an exterior of the vehicle. The vehicle can be or include a car, a bus, a train, a boat, an airplane, a helicopter, an unmanned aerial vehicle (UAV), a spacecraft, or the like.

Figure 17:
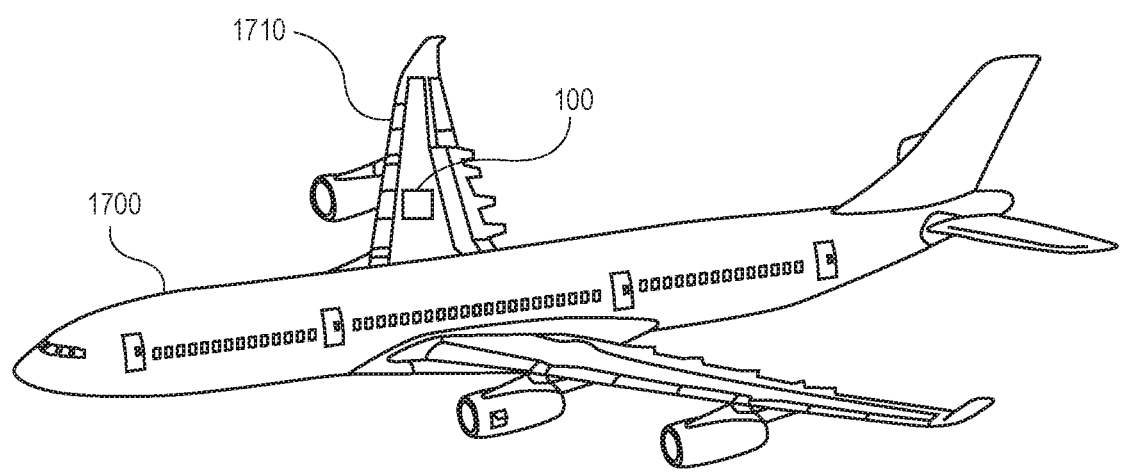
FIG. 17 illustrates an example of a vehicle to which the solar panel can be coupled, according to an implementation.

FIG. 17 illustrates an example of a vehicle 1700 to which the solar panel 100 can be coupled, according to an implementation. As mentioned above, the vehicle 1700 can be or include a car, a bus, a train, a boat, an airplane, a helicopter, an unmanned aerial vehicle (UAV), a spacecraft, or the like. In this particular example, the vehicle 1700 is an aircraft (e.g., an airplane). The solar panel 100 can be coupled to an outer surface of the vehicle 1700. In this example, the solar panel 100 is coupled to the wing 1710; however, the solar panel 100 can also or instead be coupled to other portions of the vehicle 1700. The solar panel 100 can convert sunlight into energy, which can be supplied to the vehicle 1700 and/or the components therein (e.g., communication systems, lighting, etc.).

As used herein, the terms "inner" and "outer"; "up" and "down"; "upper" and "lower"; "upward" and "downward"; "upstream" and "downstream"; "above" and "below"; "inward" and "outward"; and other like terms as used herein refer to relative positions to one another and are not intended to denote a particular direction or spatial orientation. The terms "couple," "coupled," "connect," "connection," "connected," "in connection with," and "connecting" refer to "in direct connection with" or "in connection with via one or more intermediate elements or members." Similarly, the terms "bonded" and "bonding" refer to "directly bonded to" or "bonded to via one or more intermediate elements, members, or layers."

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. As used herein, the terms "a", "an", and "the" may refer to one or more elements or parts of elements. As used herein, the terms "first" and "second" may refer to two different elements or parts of elements. As used herein, the term "at least one of A and B" with respect to a listing of items such as, for example, A and B, means A alone, B alone, or A and B. Those skilled in the art will recognize that these and other variations are possible. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indictates that the value listed may be somewhat altered, as long as the alteration does not result in nonconformance of the process or structure to the intended purpose described herein. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A solar panel, comprising:
  a substrate comprising:
    a front portion comprising:
      an electrical insulation layer; and
      a front face sheet layer bonded to the electrical insulation layer; and
    a back portion, wherein the front portion of the substrate and the back portion of the substrate are bonded together, and wherein the back portion comprises:
      a honeycomb core layer, wherein a channel is defined in the honeycomb core layer by a reduced inner surface of the honeycomb core layer and one or more channel boundary portions of the honeycomb core layer that extend from the reduced inner surface toward the front face sheet layer; and
      a back face sheet layer bonded to the honeycomb core layer, wherein the channel does not extend into or through the back face sheet layer; and
  a first wire positioned at least partially in the channel, wherein the channel and at least a portion of the first wire in the channel are parallel with the electrical insulation layer, the front face sheet layer, and the back face sheet layer, and wherein the parallel portion of the first wire is directly contacting a lower surface of the front face sheet layer.

2. The solar panel of claim 1, wherein the first wire is positioned in the channel at least partially between the front face sheet layer and the reduced inner surface of the honeycomb core layer.

3. The solar panel of claim 1, wherein the first wire is bonded to the front face sheet layer and the honeycomb core layer.

4. The solar panel of claim 2, wherein the reduced inner surface of the honeycomb core layer is not in contact with the front face sheet layer.

5. The solar panel of claim 1, wherein the one or more channel boundary portions of the honeycomb core layer are in contact with the front face sheet layer.

6. The solar panel of claim 2, further comprising a cell bonded to the electrical insulation layer.

7. The solar panel of claim 6, wherein the first wire is connected to the cell.

8. The solar panel of claim 7, further comprising a second wire bonded to the electrical insulation layer, the back face sheet layer, or both, wherein at least a portion of the first wire is substantially parallel to the substrate, and wherein the second wire is perpendicular to the first wire.

9. The solar panel of claim 1, wherein the first wire is bonded directly to the front face sheet layer and the reduced inner surface of the honeycomb core layer.

10. The solar panel of claim 1, wherein the one or more channel boundary portions comprise a first channel boundary portion and a second channel boundary portion with the reduced inner surface positioned therebetween, and wherein the first wire extends from the first channel boundary portion to the second channel boundary portion.

11. The solar panel of claim 1, wherein a depth of the channel is substantially the same as a thickness of the first wire.

12. The solar panel of claim 1, wherein a depth of the channel is less than a thickness of the honeycomb core layer.

13. The solar panel of claim 1, wherein the channel is fully encapsulated by the front face sheet layer and the honeycomb core layer.

* * * * *